United States Patent
Rajashekhar et al.

(10) Patent No.: US 7,471,129 B2
(45) Date of Patent: Dec. 30, 2008

(54) DEVICE FOR UTILIZATION WITH THE SYNCHRONIZATION OF CLOCK SIGNALS, AND CLOCK SIGNAL SYNCHRONIZING METHOD

(75) Inventors: Rao Rajashekhar, Munich (DE); Alessandro Minzoni, Morrisville, NC (US); Musa Saglam, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/574,117

(22) PCT Filed: Sep. 10, 2004

(86) PCT No.: PCT/EP2004/052128

§ 371 (c)(1),
(2), (4) Date: Aug. 10, 2007

(87) PCT Pub. No.: WO2005/031548

PCT Pub. Date: Apr. 7, 2005

(65) Prior Publication Data

US 2008/0001639 A1     Jan. 3, 2008

(30) Foreign Application Priority Data

Sep. 30, 2003   (DE) ............... 103 45 489

(51) Int. Cl.
*H03L 7/06* (2006.01)
(52) U.S. Cl. ..................................... 327/158
(58) Field of Classification Search ............... 327/155, 327/156, 158, 159, 161
See application file for complete search history.

(56) References Cited

U.S. PATENT DOCUMENTS

| | | | | |
|---|---|---|---|---|
| 5,552,726 A * | 9/1996 | Wichman et al. | ........... | 327/149 |
| 6,445,231 B1 * | 9/2002 | Baker et al. | ............ | 327/158 |
| 6,573,776 B2 | 6/2003 | Miyamoto | | |
| 6,583,656 B1 | 6/2003 | Liu | | |
| 6,765,976 B1 * | 7/2004 | Oh | ........... | 375/376 |
| 6,836,166 B2 * | 12/2004 | Lin et al. | ............ | 327/158 |
| 7,138,845 B2 * | 11/2006 | Lin | ............ | 327/277 |
| 7,304,515 B2 * | 12/2007 | Brox et al. | ........... | 327/158 |
| 2002/0041196 A1 | 4/2002 | Demone et al. | | |
| 2002/0168820 A1 | 11/2002 | Kozicki et al. | | |

OTHER PUBLICATIONS

"A Pseudo Multi-Bank DRAM with Categorized Access Sequence", Shinichiro Shiratake, et al., 1999 Symposium on VLSI Circuits Digest of Technical Papers, pp. 127-130.

* cited by examiner

*Primary Examiner*—Jeffrey S Zweizig
(74) *Attorney, Agent, or Firm*—Dicke, Billig & Czaja, PLLC (57) ABSTRACT

A clock signal synchronization method and an apparatus device for utilization with the synchronization of clock signals is disclosed. In one embodiment the apparatus includes a delay device with a variably controllable delay time into which a clock signal, or a signal obtained therefrom, is input, charged with the variably controllable delay time, and output as a delayed clock signal. A device is provided for determining whether a clock edge of the delayed clock signal output by the delay device, or of a signal obtained therefrom, lies within a predetermined time window before a corresponding clock edge of the clock signal, or of the signal obtained therefrom.

16 Claims, 4 Drawing Sheets

FIG 2

DEVICE FOR UTILIZATION WITH THE SYNCHRONIZATION OF CLOCK SIGNALS, AND CLOCK SIGNAL SYNCHRONIZING METHOD

CROSS REFERENCE TO RELATED APPLICATION

This Utility Patent Application claims the benefit of the filing date of German Application No. DE 103 45 489.6, filed Sep. 30, 2003, and International Application No. PCT/EP2004/052128, filed Sep. 10, 2004, both of which are herein incorporated by reference.

FIELD OF THE INVENTION

The invention relates to a device for utilization with the synchronization of clock signals, in particular a device for utilization with the synchronization of a clock signal used internally in a memory chip with a clock signal output externally into the memory chip, as well as to a clock signal synchronizing method.

BACKGROUND

With semiconductor devices, in particular with memory devices such as DRAMS (DRAM=Dynamic Random Access Memory or dynamic read-write memory, respectively)—based e.g. on CMOS technology—, so-called clock signals are used for the chronological coordination of the processing or relaying, respectively, of the data.

In the case of conventional semiconductor devices, a single clock signal—that is present at a single line—is, in general, used (i.e. a so-called "single-ended" clock signal).

The data may then be relayed e.g. at the respective rising clock edge of the single clock signal (or, alternatively, e.g. at the respective falling clock edge of the single clock signal).

Furthermore, so called DDR devices, in particular DDR-DRAMs (DDR-DRAM=Double Data Rate—DRAM or DRAM with double data rate, respectively), are already known in prior art.

In the case of DDR devices—instead of one single clock signal present at a single line ("single-ended" clock signal)—two differential, oppositely-inverse clock signals present on two separate lines are used.

Whenever, e.g., the first clock signal of the two clock signals changes from a state "logic high" (e.g. a high voltage level) to a state "logic low" (e.g. a low voltage level), the second clock signal changes—substantially simultaneously—its state from "logic low" to "logic high" (e.g. from a low to a high voltage level).

Vice versa, whenever the first clock signal changes from a state "logic low" (e.g. a low voltage level) to a state "logic high" (e.g. a high voltage level), the second clock signal (again substantially simultaneously) changes its state from "logic high" to "logic low" (e.g. from a high voltage level to a low voltage level).

In DDR devices, the data are, in general, relayed both at the rising edge of the first clock signal and at the rising edge of the second clock signal (or both at the falling edge of the first clock signal and at the falling edge of the second clock signal, respectively).

Thus, relaying of the data in a DDR device is performed more frequently or more quickly, respectively (in particular twice as frequent or twice as quick, respectively) than with corresponding, conventional devices with a single or "single-ended" clock signal, i.e., the data rate is higher, in particular twice as high, as with corresponding, conventional devices.

The clock signal used—internally—in the device for the chronological coordination of the processing or relaying, respectively, of the data ("DQS" signal or "data strobe" signal, respectively) (or—when differential, oppositely-inverse clock signals are used—the internal clock signal DQS and the clock signal BDQS that is oppositely-inverse to the clock signal DQS) must be synchronous to a clock signal ("CLK" signal or "clock" signal, respectively) input externally into the device (or synchronous to the differential clock signals CLK, BCLK input externally into the device, respectively).

The external clock signal(s) CLK, BCLK is/are generated by an appropriate clock signal generator connected with the device.

For synchronizing the internally generated clock signal DQS or the internally generated clock signals DQS, BDQS, respectively, with the external clock signal(s) CLK, BCLK, a clock signal synchronizer, e.g. a DLL circuit (DLL=Delay-Locked-Loop) is used. Such a circuit is, for instance, known from EP 964 517.

A clock signal synchronizer may, for instance, comprise a first delay means into which the external clock signal(s) CLK, BCLK is/are input, and which charges the input clock signal(s) CLK, BCLK—as a function of a control signal output by a phase comparator—with a variable delay time $t_{var}$ that is adjustable by the control signal.

The signal(s) output by the first delay means may be used—internally—in the device for the chronological coordination of the processing or relaying, respectively, of the data (i.e. as—internal—clock signal(s) DQS or BDQS, respectively).

The signal DQS output by the first delay means is supplied to a second delay means that charges the input signal DQS with a—fixed—delay time $t_{const}$ corresponding approximately to the sum of the signal delays caused by the receiver(s) ("receiver delay"), the respective data path ("data path delay"), and the off-chip driver(s) ("OCD delay").

The signal output by the second delay means (FB signal or "feedback signal", respectively) is supplied to the above-mentioned phase comparator; there, the phasing of the FB signal is compared to that of the CLK signal that has also been input into the phase comparator. Depending on whether the phase of the FB signal hurries ahead or runs after that of the CLK signal, the phase comparator outputs—as a control signal for the above-mentioned first delay means—an incrementing signal (INC signal) or a decrementing signal (DEC signal), which result in that the delay $t_{var}$ of the CLK signal effected by the first delay means is—in the case of an INC signal—incremented, or—in the case of a DEC signal—decremented, so that the CLK signal and the FB signal are finally synchronized, i.e. the clock signal synchronizer is "locked."

For instance, in a first phase (when the positive edge of the FB signal (still) runs after the positive edge of the CLK signal), the phase comparator may initially generate an INC signal resulting in that the delay $t_{var}$ caused by the first signal delay means is incremented—relatively strongly—, or the phase rate of the FB signal is incremented—relatively strongly—vis-à-vis the phase rate of the CLK signal, respectively ("coarse adjustment").

When the positive edge of the FB signal "overtakes" the positive edge of the CLK signal, the phase comparator may generate a DEC signal resulting in that the delay $t_{var}$ caused by the first delay means is (again) decremented, or the phase rate of the FB signal is decremented vis-à-vis the phase rate of the CLK signal (namely—for "fine adjustment"—only relatively slightly).

By the initially strong and then relatively weak changes of the delays $t_{var}$ or phase shifts, respectively, caused by the first signal delay means, a relatively quick synchronization of the CLK and FB signals can—as a rule—be achieved, i.e. the clock signal synchronizer can be "locked" relatively quickly.

However—due to the signal delays occurring in the DLL circuit—the above-described decrementation of the FB signal phase rate caused by the DEC signal vis-à-vis the CLK signal phase rate is effected only some clocks (e.g. four clocks) after the positive edge of the FB signal has "overtaken" the positive edge of the CLK signal.

This may result in that the FB signal meanwhile hurries ahead the CLK signal so far (in particular that e.g. the positive edge of the FB signal has "overtaken" the negative edge of the CLK signal) that the phase comparator again outputs an INC signal, etc., etc., so that the CLK and the FB signals cannot be synchronized, i.e. the clock signal synchronizer cannot be "locked."

For these and other reasons there is a need for the present invention.

SUMMARY

The present invention provides a novel device for utilization with the synchronization of clock signals, and a novel clock signal synchronization method, in particular a device and a method with which the described disadvantages of previous corresponding devices or methods can be eliminated at least in part.

In accordance with one embodiment of the invention there is provided an apparatus for utilization with the synchronization of clock signals, comprising a delay device with a variably controllable delay time, into which a clock signal, or a signal obtained therefrom, is input, charged with the variably controllable delay time, and output as a delayed clock signal, wherein a device is provided for determining whether a clock edge of the delayed clock signal output by the delay device, or of a signal obtained therefrom, lies within a predetermined time window before a corresponding clock edge of the clock signal, or of the signal obtained therefrom.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

In the following, the invention will be explained in more detail by means of embodiments and the enclosed drawing.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
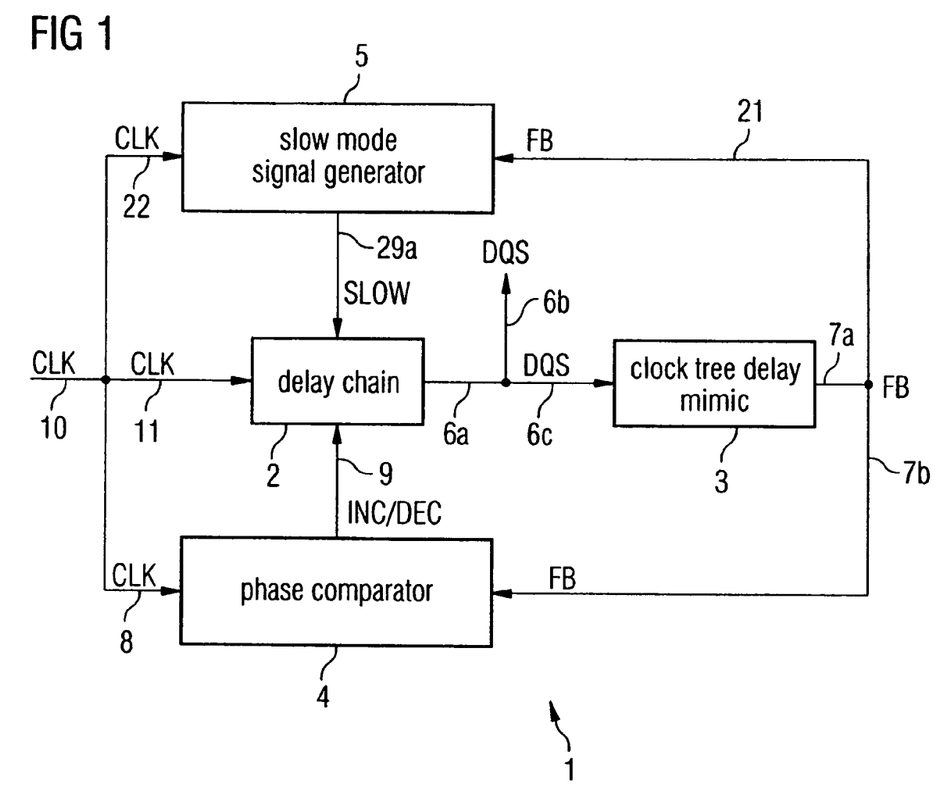
FIG. 1 illustrates a schematic representation of a clock signal synchronizer according to an embodiment of the invention.

FIG. 1 illustrates a schematic representation of a clock signal synchronizer 1 according to an embodiment of the invention.

It includes—correspondingly similar to conventional clock signal synchronizers—first delay means 2, second delay means 3, and a phase comparator 4, as well as—different from conventional clock signal synchronizers, and as will be explained in detail in the following—a specifically designed control means 5 used for controlling the clock signal synchronizing process.

The clock signal synchronizer 1 may, e.g., be provided on a semiconductor device, in particular a memory device such as a DRAM (DRAM=Dynamic Random Access Memory or dynamic write-read memory, respectively) based, for instance, on CMOS technology, e.g. a DDR-DRAM (DDR-DRAM=Double Data Rate—DRAM or DRAM with double data rate, respectively).

The corresponding semiconductor device comprises an—external—connection (e.g. an appropriate pad or an appropriate pin, respectively) at which—for the chronological coordination of the processing or relaying, respectively, of the data in the semiconductor device—an external clock signal CLK is applied by an external clock signal generator.

Alternatively, the device may comprise an appropriate—further—external connection (e.g. an appropriate further pad or an appropriate further pin, respectively) at which a clock signal BCLK that is inverse to the above-mentioned clock signal CLK is applied (i.e. so-called "differential" clock signals CLK, BCLK may be used).

Internally in the device, the data may, for instance, be relayed at the respective rising (or, alternatively, e.g. at the respective falling) clock edge of the above-mentioned clock signal CLK (or—more exactly—of an internal DQS clock signal obtained therefrom), or—when differential clock signals CLK and BCLK are used (or—more exactly—differential, internal clock signals DQS and BDQS obtained therefrom)—in general both at the rising edge of the CLK clock signal and at the rising edge of the BCLK clock signal (or both at the rising edge of the DQS signal and at the rising edge of the BDQS signal) (or at the falling clock edges of the corresponding signals, respectively)).

As is illustrated in FIG. 1, the CLK signal—present at the corresponding connection of the semiconductor device—is, via a line 10 and a line 11 connected thereto, supplied to the first delay means 2 provided in the clock signal synchronizer 1.

In the first delay means 2 ("delay chain" or "delay line", respectively), the CLK signal is—as a function of a control signal INC or DEC, respectively, output by the phase comparator 4—charged with a variable delay time $t_{var}$ that is adjustable by the control signal.

The signal DQS that is output by the first delay means 2 at a line 6a and a line 6b connected thereto, and that is delayed vis-à-vis the CLK signal by the above-mentioned variable delay time $t_{var}$ (or, additionally, a signal BDQS that is inverse to the signal DQS) may be used—internally—in the device for the chronological coordination of the processing or relaying, respectively, of the data (i.e. as—internal—clock signal(s) DQS or BDQS, respectively).

The BDQS signal may, for instance, be generated from the DQS signal—by inverting—, or may, for instance, be generated separately (e.g. from the BCLK signal, by using a clock signal synchronizer corresponding to the clock signal synchronizer 1 illustrated in FIG. 1).

As results further from FIG. 1, the signal DQS output by the first delay means 2 is—via the above-mentioned line 6a and a line 6c connected therewith—(additionally also) supplied to the above-mentioned second delay means 3 ("clock tree delay mimic") which charges the input signal DQS with a—fixed—delay $t_{const}$ corresponding, for instance, roughly to the sum of the signal delays caused by the receiver(s) ("receiver delay"), the respective data path ("data path delay"), and the off-chip driver(s) ("OCD delay").

The signal (FB signal or "feedback signal", respectively) output by the second delay means 3 at a line 7a and delayed vis-à-vis the DQS signal by the above-mentioned fixed delay time $t_{const}$ is, via a line 7b—that is connected with the line 7a—, supplied to a first input of the phase comparator 4, and via a line 21—that is also connected with the line 7a—(and as will be explained in detail in the following) to the control means 5 ("slow mode signal generator").

As results further from FIG. 1, the CLK signal present at the line 10 is—via a line 8 that is connected with the line 10—supplied to a (further) input of the phase comparator 4, and via a line 22—that is also connected with the line 10—(and as will be explained in detail in the following) to the control means 5 ("slow mode signal generator").

In the phase comparator 4—correspondingly similar to conventional phase comparators—the phasing of the FB signal—that is present at the line 7b and supplied to the first input of the phase comparator 4—is compared with that of the CLK signal—that is present at the line 8 and supplied to the further input of the comparator 4. Depending on whether the phase of the FB signal hurries ahead or runs after that of the CLK signal, the phase comparator 4 outputs—as a control signal for the above-mentioned first delay means 2—an incrementing signal (INC signal) at a control line 9 connected to the first delay means 2, or a decrementing signal (DEC signal) (e.g.—as INC signal—a "logic high" and—as DEC signal—a "logic low" signal (or vice versa), which results in that the delay $t_{var}$ of the CLK signal caused by the first signal delay means 2 is incremented—in the case of an INC signal (cf. e.g. the INC signal illustrated in FIG. 3), and that the hurrying ahead of the FB signal vis-à-vis the CLK signal which decreases in the periods T1 or T2 ("fast mode" or "slow mode") (arrows K, L, M), or—in the case of a DEC signal—is decremented, so that, finally, the CLK and the FB signals are synchronized, i.e. the clock signal synchronizer 1 is "locked" (i.e.—as is, for instance, illustrated at the very right in FIG. 3—the CLK signal has a positive edge A at the respective same time $t_a$ as the FB signal (edge A') (or the CLK signal has a negative edge B at the respective same time $t_b$ as the FB signal (edge B')) (period T3, "locked mode")).

As long as the positive edge A' of the FB signal hurries ahead the positive edge A of the CLK signal (as is, for instance, illustrated at the left in FIG. 3), the phase comparator 4 outputs—as a control signal for the above-mentioned first delay means 2—an INC signal at the line 9. Contrary to this, if the positive edge A' of the FB signal "overtakes" the positive edge A of the CLK signal, the phase comparator 4 would output—as a control signal for the above-mentioned first delay means 2—a DEC signal at the line 9.

If—in a first phase (period T1, "fast mode")—the phase comparator 4 outputs an INC signal (or, alternatively: a DEC signal), and if (as is, for instance, illustrated at the left in FIG. 3) the positive edge A' of the FB signal lies outside a predetermined time window that is directly before the positive edge A of the CLK signal and lasts for a predetermined, constant duration Δt (illustrated in hatching in FIG. 3)—i.e., if the positive edge A' of the FB signal occurs, e.g., at a point in time t1 that lies longer than the above-mentioned duration Δt before the point in time t2 at which the positive edge A of the CLK signal occurs (i.e. if there applies t2−Δt>t1)—, the delay $t_{var}$ caused by the first signal delay means 2 is incremented (or decremented) in relatively large time steps, i.e. relatively strongly (i.e. in respective coarse steps, e.g. by a respective "coarse unit delay" $t_c$), or the phase rate of the FB signal is—relatively strongly—incremented (or decremented) vis-à-vis the phase rate of the CLK signal ("coarse adjustment").

If—in a second phase (period T2, "slow mode")—the phase comparator 4 outputs an INC signal (or a DEC signal), and if (as is, for instance, illustrated further to the right in FIG. 3) the positive edge A' of the FB signal lies within the above-mentioned predetermined time window that is directly before the positive edge A of the CLK signal and lasts for the above-mentioned, constant duration Δt (illustrated in hatching in FIG. 3)—i.e., if the positive edge A' of the FB signal occurs at a point in time t1 that lies shorter than the above-mentioned duration Δt before the point in time t2 at which the positive edge A of the CLK signal occurs (i.e. if there applies t2−Δt≦t1)—, the delay $t_{var}$ caused by the first signal delay means 2 is incremented (or decremented) in relatively small time steps, i.e. relatively weakly (i.e. in respective fine steps, e.g. by a respective "fine unit delay" $t_f$), or the phase rate of the FB signal is—relatively weakly—incremented (or decremented) vis-à-vis the phase rate of the CLK signal ("fine adjustment").

A "coarse unit delay" $t_c$ may be by a certain factor (e.g. between three and twenty times, for instance, four, eight, or sixteen times) greater than a "fine unit delay" $t_f$ (i.e., there may, for instance, apply: $t_c=4\,t_f$, or e.g. $t_c=8\,t_f$ or e.g. $t_c=16\,t_f$, etc.).

Whether the delay $t_{var}$ caused by the first signal delay means 2 is incremented (or decremented) in relatively small time steps, i.e. relatively weakly (i.e. in respective fine steps, e.g. by the respective above-mentioned "fine unit delay" $t_f$)—i.e. the system is in the above-mentioned "slow mode"—, or whether the delay $t_{var}$ caused by the first signal delay means 2 is incremented (or decremented) in relatively large time steps, i.e., relatively strongly (i.e. in respective coarse steps, e.g. by the respective above-mentioned "coarse unit delay" $t_c$)—i.e. the system is in the above-mentioned "fast mode"—, is—as will be explained in more detail in the following—determined by the above-mentioned control means 5.

If the above-mentioned control means 5 determines that the system is in the "fast mode" (i.e. if the control means 5 determines that the positive edge A' of the FB signal lies outside the predetermined time window that is directly before the positive edge A of the CLK signal), the control means 5 outputs a "logic low" control signal and supplies same—via a line 29$a$—to the first signal delay means 2 (which then—as explained above—increments (or decrements) the delay time $t_{var}$ caused by it in relatively large time steps, i.e. relatively strongly).

If, contrary to this, the above-mentioned control means 5 determines that the system is in the "slow mode" (i.e. if the control means 5 determines that the positive edge A' of the FB signal lies within the predetermined time window that is directly before the positive edge A of the CLK signal), the control means 5 outputs a "logic high" control signal (SLOW signal) and supplies same—via the above-mentioned line 29$a$—to the first signal delay means 2 (which then—as explained above—increments (or decrements) the delay time $t_{var}$ caused by it in relatively small time steps, i.e. relatively weakly, only.

The duration $\Delta t$ of the time window may e.g. be a multiple of the above-mentioned "coarse unit delay" $t_c$, e.g. between the two- and sixteen-fold of the above-mentioned "coarse unit delay" $t_c$ (in the present embodiment in particular—and, as will be explained in more detail in the following, depending on the frequency of the CLK signal—either the two-fold or the four-fold of the above-mentioned "coarse unit delay" $t_c$).

Figure 2:
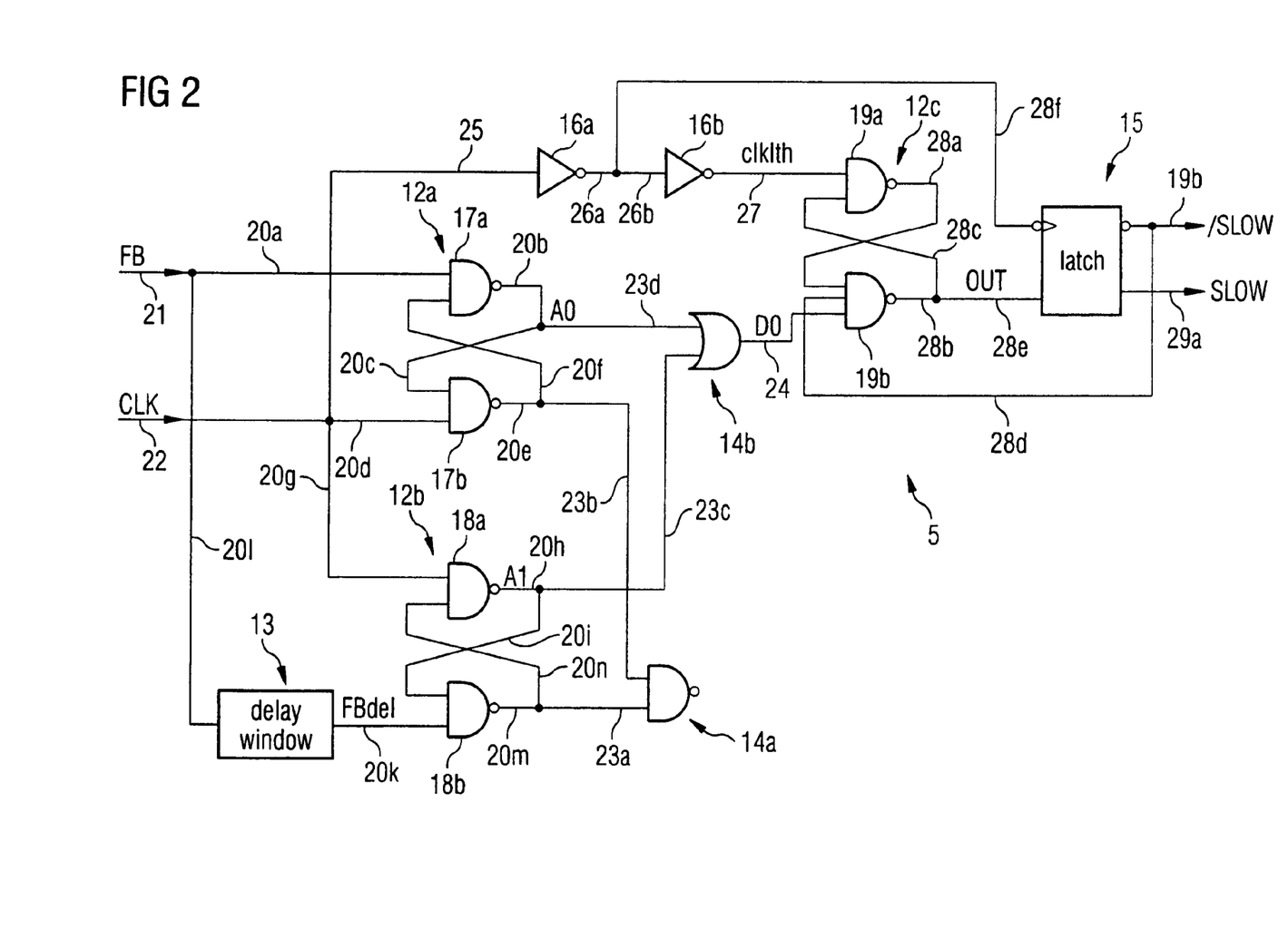
FIG. 2 illustrates a schematic detailed representation of a control means used with the clock signal synchronizer in accordance with FIG. 1 for controlling the clock signal synchronizing process.

FIG. 2 illustrates a schematic detailed representation of the control means 5 used in the clock signal synchronizer 1 according to FIG. 1 for controlling the clock signal synchronizing process.

As results from FIG. 2, the control means 5 comprises a first and a second—appropriately switched—RS-flip-flop 12$a$, 12$b$, a—further—flip-flop 12$c$, delay means 13, a NAND gate 14$a$, an OR gate 14$b$, a latch 15, and two inverters 16$a$, 16$b$.

The first RS-flip-flop 12$a$ comprises two NAND gates 17$a$, 17$b$ (here: two 2-NAND gates 17$a$, 17$b$), and the second RS-flip-flop 12$b$ two NAND gates 18$a$, 18$b$ (here: two 2-NAND gates 18$a$, 18$b$).

A first input of the first NAND gate 17$a$ of the first RS-flip-flop 12$a$ is—via a line 20$a$—connected with the above-mentioned line 21 via which the above-mentioned FB signal is input into the control means 5.

The output of the first NAND gate 17$a$ of the first RS-flip-flop 12$a$ is—via a line 20$b$ and a line 20$c$ connected therewith—fed back to a first input of the second NAND gate 17$b$ of the first RS-flip-flop 12$a$ (so that a signal (A0 signal) output at the output of the first NAND gate 17$a$ of the first RS-flip-flop 12$a$ is supplied to the first input of the second NAND gate 17$b$ of the first RS-flip-flop 12$a$).

Furthermore, a second input of the second NAND gate 17$b$ of the first RS-flip-flop 12$a$ is—via a line 20$d$—connected to the above-mentioned line 22 via which the above-mentioned CLK signal is input into the control means 5.

The output of the second NAND gate 17$b$ of the first RS-flip-flop 12$a$ is—via a line 20$e$ and a line 20$f$ connected therewith—fed back to a second input of the first NAND gate 17$a$ of the first RS-flip-flop 12$a$ (so that a signal output at the output of the second NAND gate 17$b$ of the first RS-flip-flop 12$a$ is supplied to the second input of the first NAND gate 17$a$ of the first RS-flip-flop 12$a$).

As results further from FIG. 2, a first input of the first NAND gate 18$a$ of the second RS-flip-flop 12$b$ is—via a line 20$g$—connected with the above-mentioned line 22 via which the above-mentioned CLK signal is input into the control means 5.

The output of the first NAND gate 18$a$ of the second RS-flip-flop 12$b$ is—via a line 20$h$ and a line 20$i$ connected therewith—fed back to a first input of the second NAND gate 18$b$ of the second RS-flip-flop 12$b$ (so that a signal (A1 signal) output at the output of the first NAND gate 18$a$ of the second RS-flip-flop 12$b$ is supplied to the first input of the second NAND gate 18$b$ of the second RS-flip-flop 12$b$).

Furthermore, a second input of the second NAND gate 18$b$ of the second RS-flip-flop 12$b$ is—via a line 20$k$—connected with an output of the above-mentioned delay means 13 whose input is—via a line 20$l$—connected with the above-mentioned line 21 (so that a signal FBdel that is correspondingly delayed—by the delay means 13—vis-à-vis the FB signal present at the line 21 is applied to the second input of the second NAND gate 18$b$ of the second RS-flip-flop 12$b$).

The output of the second NAND gate 18$b$ of the second RS-flip-flop 12$b$ is—via a line 20$m$ and a line 20$n$ connected therewith—fed back to a second input of the first NAND gate 18$a$ of the second RS-flip-flop 12$b$ (so that a signal output at the output of the second NAND gate 18$b$ of the second RS-flip-flop 12$b$ is supplied to the second input of the first NAND gate 18$a$ of the second RS-flip-flop 12$b$).

As results further from FIG. 2, the signal output at the output of the second NAND gate 18$b$ of the second RS-flip-flop 12$b$ is—via the above-mentioned line 20$m$ and a line 23$a$ connected therewith—additionally also supplied to a second input of the NAND gate 14$a$.

Correspondingly similar, the signal output at the output of the second NAND gate 17$b$ of the first RS-flip-flop 12$a$ is (except—via the lines 20$e$, 20$f$—to the second input of the first NAND gate 17$a$ of the first RS-flip-flop 12$a$) additionally also supplied to a first input of the NAND gate 14$a$ via the above-mentioned line 20$e$ and a line 23$b$ connected therewith.

Thus, it is achieved that the load present at the output of the second NAND gate 17$b$ of the first RS-flip-flop 12$a$ and at the output of the second NAND gate 18$b$ of the second RS-flip-flop 12$b$ (which is i.a. formed by the NAND gate 14$a$) is substantially as large as the load present at the output of the first NAND gate 17$a$ of the first RS-flip-flop 12 and at the output of the first NAND gate 18$a$ of the second RS-flip-flop 12$b$ (which is i.a. formed by the OR gate 14$b$).

As results further from FIG. 2, the signal (A0 signal) output at the output of the first NAND gate 17$a$ of the first RS-flip-flop 12$a$ is (except—via the above-mentioned lines 20$b$, 20$c$—to the first input of the second NAND gate 17$b$ of the first RS-flip-flop 12$a$) additionally also supplied to a first input of the OR gate 14$b$ via the above-mentioned line 20$b$ and a line 23$d$ connected therewith.

Correspondingly similar, the signal (A1 signal) output at the output of the first NAND gate 18$a$ of the second RS-flip-flop 12$b$ is (except—via the above-mentioned lines 20$h$, 20$i$—to the first input of the second NAND gate 18$b$ of the second RS-flip-flop 12$b$) additionally also supplied to a second input of the OR gate 14$b$ via the above-mentioned line 20$h$ and a line 23$c$ connected therewith.

The output of the OR gate 14$b$ is connected via a line 24 with the above-mentioned (third) flip-flop 12$c$ of the control means 5 (namely with a third input of a NAND gate 19$b$ (here: a 3-NAND gate 19$b$) of the flip-flop 12$c$).

As results further from FIG. 2, the flip-flop 12$c$ comprises—in addition to the NAND gate 19$b$—a further NAND gate 19$a$ (here: a 2-NAND gate 19$a$).

In accordance with FIG. 2, an input of the above-mentioned (first) inverter 16$a$ is—via a line 25—connected with the above-mentioned line 22 via which—as has already been mentioned above—the CLK signal is input into the control means 5.

An output of the (first) inverter 16a is—via a line 26a and a line 26b connected therewith—connected to an input of the (second) inverter 16b.

Furthermore, an output of the (second) inverter 16b is—via a line 27—connected to a first input of the first NAND gate 19a of the third flip-flop 12c of the control means 5 (so that a signal (clklth signal) output at the output of the second inverter 16b is supplied to the first input of the first NAND gate 19a of the third flip-flop 12c).

The output of the first NAND gate 19a of the third flip-flop 12c is—via a line 28a—fed back to a first input of the second NAND gate 19b of the third flip-flop 12c (so that a signal output at the output of the first NAND gate 19a of the flip-flop 12c is supplied to the first input of the second NAND gate 19b of the flip-flop 12c).

Correspondingly conversely, the output of the second NAND gate 19b of the flip-flop 12c is—via a line 28b and a line 28c connected therewith—fed back to a second input of the first NAND gate 19a of the flip-flop 12c (so that a signal (OUT signal) output at the output of the second NAND gate 19b of the flip-flop 12c is supplied to the second input of the first NAND gate 19b of the flip-flop 12c).

A second input of the second NAND gate 19b of the flip-flop 12c is—via a line 28d—connected to a line 29b that is connected with a first (inverse) output of the latch 15.

A (data) input of the latch 15 is, via a line 28e and the line 28b connected therewith, connected to the output of the second NAND gate 19b of the flip-flop 12c (so that the OUT signal output at the output of the second NAND gate 19b of the flip-flop 12c is supplied to the above-mentioned (data) input of the latch 15).

As results further from FIG. 2, the output of the (first) inverter 16a is—via the above-mentioned line 26a and a line 28f connected therewith—connected to the one (inverse) (clock) input of the latch 15.

The (second, non-inverse) output of the latch 15 is connected to the line 29a—which has already been mentioned above—, and the (first, inverse) output of the latch 15 is connected to the above-mentioned line 29b (so that the (control) signal (SLOW signal) output at the second, non-inverse output of the latch 15 is—as results from FIG. 1—supplied to the first delay means 2 of the clock signal synchronizer 1 via the above-mentioned line 29a and—as results from FIG. 2 and has already been explained above—the signal/SLOW that is inverse to the SLOW signal—via the line 28d—to the second input of the second NAND gate 19b of the third flip-flop 12c).

Figure 4:
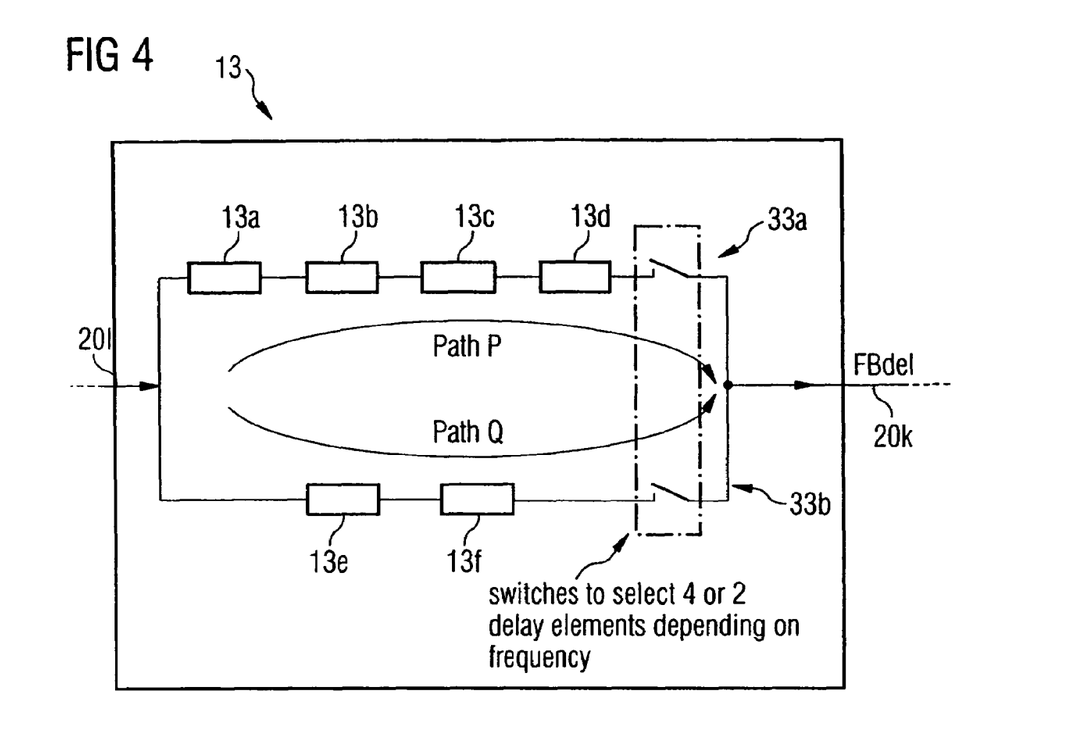
FIG. 4 illustrates a schematic detailed representation of the delay means used in the control means according to FIG. 2.

FIG. 4 illustrates a schematic detailed representation of the delay means 13 used in the control means 5 according to FIG. 2. It comprises e.g.—in a first signal path P—four delay elements 13a, 13b, 13c, 13d, and—in a second signal path Q—two delay elements 13e, 13f.

Each of the delay elements 13a, 13b, 13c, 13d, 13e, 13f causes a delay of the respectively input signal by the above-mentioned "coarse unit delay" $t_c$—that has already been explained with respect to the above-mentioned first delay means 2—(wherein, in the first delay means 2 of the clock signal synchronizer 1 shown in FIG. 1, correspondingly identical delay elements are used as in the delay means 13 of the control means 5 illustrated in FIGS. 2 and 4).

Depending on whether the frequency (that is, for instance, determined by an appropriate frequency determination means) of the CLK signal lies above or below a predetermined threshold value S, corresponding switches 33a, 33b provided in the delay means 13 are correspondingly—automatically (and, for instance, controlled by the above-mentioned frequency determination means)—opened or closed (so that—at a relatively low frequency of the CLK signal—the signal input into the delay means 13 is, e.g. by the four delay elements 13a, 13b, 13c, 13d (i.e. relatively strongly) delayed (signal path P (or switch 33a) closed, and signal path Q (or switch 33b) open)), and—at a relatively high frequency of the CLK signal—the signal input into the delay means 13 is delayed merely by the two delay elements 13e, 13f (i.e. is delayed relatively weakly) (signal path P (or switch 33a) open, and signal path Q (or switch 33b) closed)).

The above-mentioned threshold value S for the frequency may, for instance, range between 100 MHz and 1000 MHz, e.g. at 250 MHz.

Figure 3:
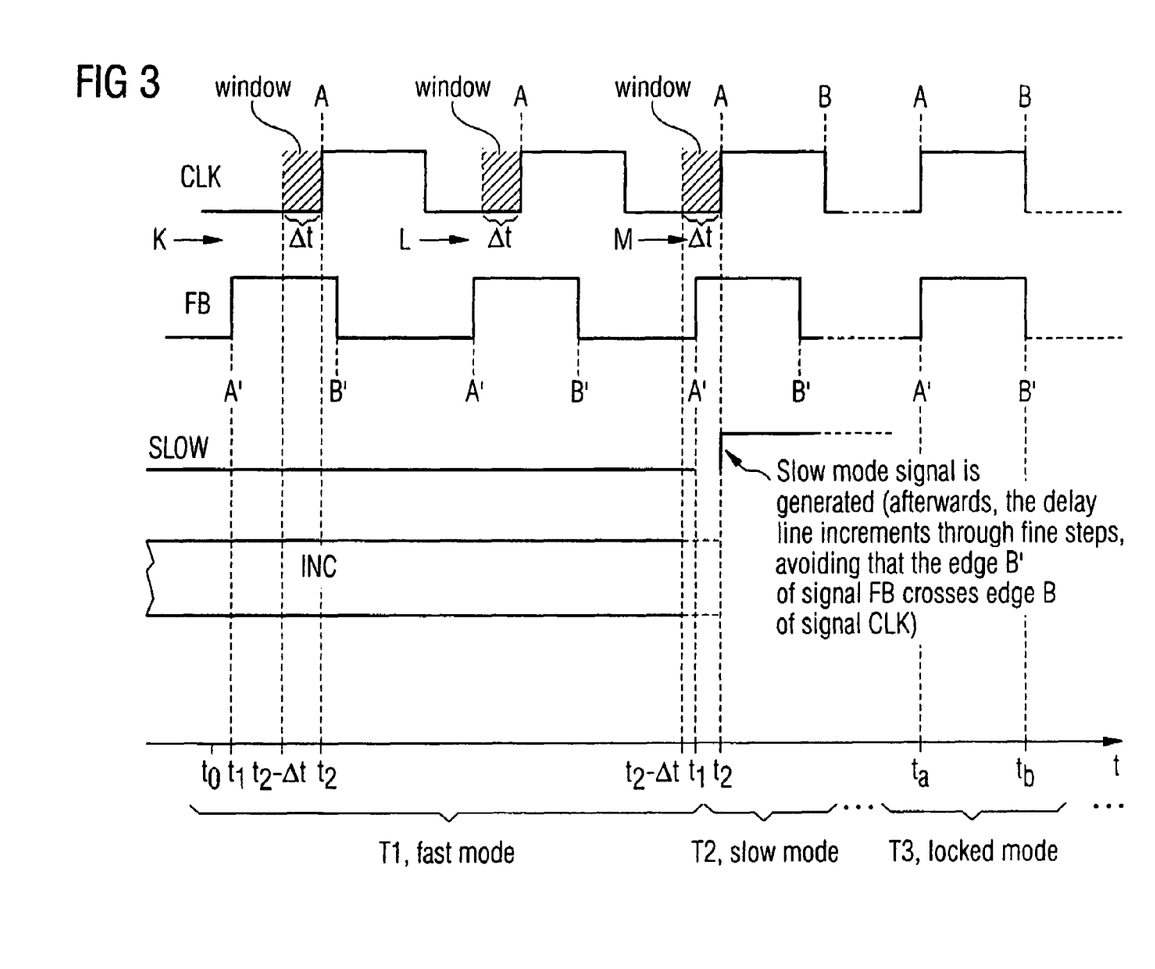
FIG. 3 illustrates time flowcharts of the FB and CLK signals input into the control means illustrated in FIG. 2, and of the control signal (SLOW signal) output by the control means and used for controlling the clock signal synchronizing process.

In other words, the "width" or the above-mentioned duration Δt of the time window illustrated (in hatching) in FIG. 3 and being directly before the positive edge A of the CLK signal may thus be changed—independently of the frequency—by the switches 33a, 33b.

If—as illustrated in FIG. 3 e.g. at an initial point in time $t_0$—both the CLK and the FB signals are in a "logic low" state, the first RS-flip-flop 12a (or its first NAND gate 17a, respectively) outputs—as results from FIG. 2—a "logic high" signal ("A0 signal") at the above-mentioned line 23d.

Correspondingly similar—as also results from FIG. 2—the second RS-flip-flop 12b (or its first NAND gate 18a, respectively) outputs a "logic high" signal ("A1 signal") at the corresponding line 23c—the signal ("D0" signal) output by the OR gate 14b at the line 24 is then—also—"logic high".

The signal ("D0" signal) output by the OR gate 14b at the line 24 only becomes "logic low" if both the A0 signal output by the first RS-flip-flop 12a at the above-mentioned line 23d and the A1 signal output by the second RS-flip-flop 12b at the corresponding line 23c are "logic low." A "logic low" D0 signal indicates that the "slow mode" is to be changed to.

This is only the case (i.e. the D0 signal only becomes "logic low") if—as will be explained in the following—the positive edge A' of the FB signal—as is, for instance, illustrated at the right in FIG. 3—lies within the above-mentioned time window that is directly before the positive edge A f the CLK signal and lasts for the above-mentioned duration Δt (illustrated in hatching in FIG. 3)—i.e. the positive edge A' of the FB signal occurs, for instance, at a point in time t1 that is shorter than the above-mentioned duration Δt before the point in time t2 at which the positive edge A of the CLK signal occurs.

Otherwise (i.e. if the positive edge A' of the FB signal—as is, for instance, illustrated at the left in FIG. 3—lies outside the above-mentioned time window), the signal (A0 signal) output by the first RS-flip-flop 12a at the above-mentioned line 23d indeed changes its state to "logic low"—after a positive edge A' of the FB signal and a subsequent positive edge A of the CLK signal.

However—after a positive edge A' of the FB signal and a subsequent positive edge A of the CLK signal—the signal (A1 signal) output by the second RS-flip-flop 12b at the above-mentioned line 23c remains in a state "logic high" (since—despite the delay of the FB signal by the above-mentioned duration Δt caused by the delay means 13—a "logic high" signal is present at the second RS-flip-flop 12 initially at the second input of the second NAND gate 18b and only subsequently at the first input of the first NAND gate 18a (and not in the opposite order) (so that the "logic low" signal—that is initially output at the output of the second NAND gate 18b and is supplied to the second input of the first NAND gate 18a—"blocks" the first NAND gate 18a (i.e. outputs a "logic high" signal at the line 23c even if the CLK signal then changes its state to "logic high"))).

If, contrary to this, the positive edge A' of the FB signal lies—as is e.g. illustrated at the right in FIG. 3—within the above-mentioned time window that is directly before the positive edge A of the CLK signal and lasts for the above-mentioned duration Δt, the signal (A1 signal) output by the second RS-flip-flop 12b at the above-mentioned line 23c changes—after a positive edge A' of the FB signal and a subsequent positive edge A of the CLK signal—its state—corresponding to the signal A0 output by the first RS-flip-flop 12a at the line 23d—to "logic low" (since—by the delay of the FB signal by the above-mentioned duration Δt caused by the delay means 13 (and the relatively short time distance between the edges A' and A)—a "logic high" signal is present at the second RS-flip-flop 12b initially at the first input of the first NAND gate 18a and only subsequently at the second input of the second NAND gate 18b (so that by the "logic high" signal that is then present at the first input of the first NAND gate 18a and the—also—"logic high" signal that is present at the second input of the first NAND gate 18a, a "logic low" A1 signal is then output at the output of the first NAND gate 18a (and thus at the above-mentioned line 23c).

By the above-mentioned (third) flip-flop 12c—following the RS-flip-flops 12a, 12b—, or the latch 15, respectively, the then "logic low" D0 signal (slow mode determination signal) output by the OR gate 14b is synchronized with the system clock (CLK signal).

Only if the signal ("D0" signal) output by the OR gate 14b at the line 24 and input into the NAND gate 19b of the third flip-flop 12c becomes "logic low" (i.e. if the "slow mode" is to be changed to), the OUT signal output by the NAND gate 19b at the lines 28b, 28e can—with corresponding clock edges of the CLK signal or (more exactly) of the clklth signal obtained therefrom—become "logic high" and be transmitted to the line 29a by the latch 15 as "logic high" control signal SLOW.

If the SLOW signal present at the line 29a becomes "logic high"—and consequently the signal/SLOW present a the line 29b and inverse to the SLOW signal becomes logic low—, this "logic low" signal is—via the line 28d—supplied to the (second) input of the NAND gate 19b of the flip-flop 12c, and thus it is ensured that the NAND gate 19b is—irrespective of a possible later change of state of the D0 signal present at the third input of the NAND gate 19b—kept in the present state, so that the system—once it has been detected that the positive edge A' of the FB signal lies within the above-mentioned time window that is directly before the positive edge A of the CLK signal and lasts for the above-mentioned duration Δt—remains in the "slow mode" state (until a reset is performed).

Advantageously, the above-mentioned delay means 2, 3 of the clock signal synchronizer 1 and/or the control means 5 are—e.g. by an appropriate choice of the above-mentioned delays caused by the means 2, 3 or the means 13 provided in the device 5—equipped and designed such that it is avoided that the positive edge A' of the FB signal can—e.g. starting out from the state illustrated at the left in FIG. 3—overtake the positive edge A of the CLK signal, or alternatively: overtake it too far.

Thus, it is ensured that a quick and safe synchronization of the CLK and FB signals is achieved, i.e. that the clock signal synchronizer 1 is adapted to be quickly and safely "locked" or placed in the "locked mode", respectively.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An apparatus for utilization with the synchronization of clock signals, comprising:
   a delay device with a variably controllable delay time into which a clock signal, or a signal obtained therefrom, is input, charged with the variably controllable delay time, and output as a delayed clock signal;
   a device configured to determine whether a clock edge of the delayed clock signal output by the delay device, or of a signal obtained therefrom, lies within a predetermined time window before a corresponding clock edge of the clock signal, or of the signal obtained therefrom; and
   a frequency detection device, wherein a duration of the time window is determined as a function of the frequency of the clock signal detected by the frequency detection device.

2. The apparatus according to claim 1, comprising wherein:
   if it is determined that the clock edge of the delayed clock signal output by said delay device, or of the signal obtained therefrom, lies within the predetermined time window before the corresponding clock edge of the clock signal, or of the signal obtained therefrom, said device sends a determination signal to said delay device.

3. The apparatus according to claim 2, comprising wherein the delay device changes from a first to a second mode in reaction to the determination signal.

4. The apparatus according to claim 3, comprising wherein:
   if the device determines that the clock edge of the delayed clock signal output by said delay device, or of the signal obtained therefrom, lies within the predetermined time window before the corresponding clock edge of the clock signal, or of the signal obtained therefrom, the signal delay time caused by said delay device is decremented or incremented in smaller time steps than prior to the determination.

5. The apparatus according to claim 1, comprising wherein:
   if the device determines that the clock edge of the delayed clock signal output by said delay device, or of the signal obtained therefrom, lies within the predetermined time window before the corresponding clock edge of the clock signal, or of the signal obtained therefrom, the signal delay time caused by said delay device is decremented or incremented in smaller time steps than prior to the determination.

6. The apparatus according to claim 1, comprising wherein the duration of the time window is chosen as a function of the frequency of the clock signal.

7. An apparatus for utilization with the synchronization of clock signals, comprising:
   a delay device with a variably controllable delay time into which a clock signal, or a signal obtained therefrom, is input, charged with the variably controllable delay time, and output as a delayed clock signal;
   a device configured to determine whether a clock edge of the delayed clock signal output by the delay device, or of a signal obtained therefrom, lies within a predetermined time window before a corresponding clock edge of the clock signal, or of the signal obtained therefrom, wherein if it is determined that the clock edge of the delayed clock signal output by said delay device, or of the signal obtained therefrom, lies within the predetermined time window before the corresponding clock edge of the clock signal, or of the signal obtained therefrom, said device sends a determination signal to said delay device, and wherein the delay device changes from a first to a second mode in reaction to the determination signal; and a second device for keeping the delay device in the second mode after it has been determined that the clock edge of the delayed clock signal output by said delay device, or of the signal obtained therefrom, lies within the predetermined time window before the corresponding clock edge of the clock signal, or of the signal obtained therefrom; and a detection device continued to determine a duration of the time window as a function of the frequency of the clock signal detected by the detection device.

8. The apparatus according to claim 7, comprising wherein the delay device changes from a first to a second mode in reaction to the determination signal.

9. The apparatus according to claim 8, comprising wherein:

if the device determines that the clock edge of the delayed clock signal output by said delay device, or of the signal obtained therefrom, lies within the predetermined time window before the corresponding clock edge of the clock signal, or of the signal obtained therefrom, the signal delay time caused by said delay device is decremented or incremented in smaller time steps than prior to the determination.

10. The apparatus of claim 7, comprising wherein the detection device is switched automatically.

11. An apparatus for utilization with the synchronization of clock signals, comprising:

a delay device with a variably controllable delay time that can be decremented or incremented in variably controllable time steps, into which a clock signal, or a signal obtained therefrom, is input, charged with the variably controllable delay time that can be decremented or incremented in variably controllable time steps, and output as delayed clock signal;

a device configured to determine whether a clock edge of the delayed clock signal output by said delay device, or of a signal obtained therefrom, lies within a predetermined time window before a corresponding clock edge of the clock signal, or of the signal obtained therefrom; and wherein the apparatus is designed and equipped such that, if the device determines that the clock edge of the delayed clock signal output by the delay device, or of the signal obtained therefrom, lies within the predetermined time window before the corresponding clock edge of the clock signal, or of the signal obtained therefrom, the signal delay time caused by the delay device is decremented or incremented in smaller time steps, and thus more slowly, than prior to the determination; and wherein a duration of the time window is chosen as a function of the frequency of the clock signal, and a frequency determination device configured to determine the duration of the time window.

12. The apparatus according to claim 11, comprising wherein:

if it is determined that the clock edge of the delayed clock signal output by said delay device, or of the signal obtained therefrom, lies within the predetermined time window before the corresponding clock edge of the clock signal, or of the signal obtained therefrom, said device sends a determination signal to said delay device.

13. The apparatus according to claim 12, comprising wherein the delay device changes from a first to a second mode in reaction to the determination signal.

14. The apparatus according to claim 13, comprising wherein:

if the device determines that the clock edge of the delayed clock signal output by said delay device, or of the signal obtained therefrom, lies within the predetermined time window before the corresponding clock edge of the clock signal, or of the signal obtained therefrom, the signal delay time caused by said delay device is decremented or incremented in smaller time steps than prior to the determination.

15. A clock signal synchronizing method comprising:

charging a clock signal or a signal obtained therefrom with a variably controllable delay time, so that a delayed clock signal is obtained; and determining whether a clock edge of the delayed clock signal, or of a signal obtained therefrom, lies within a predetermined time window before a corresponding clock edge of the clock signal, or of the signal obtained therefrom;

detecting a frequency of the clock signal; and determining the duration of the time window as a function of the frequency of the detected clock signal.

16. An apparatus for utilization with the synchronization of clock signals, comprising:

delay means for providing a variably controllable delay time into which a clock signal, or a signal obtained therefrom, is input, charged with the variably controllable delay time, and output as a delayed clock signal; and means for determining whether a clock edge of the delayed clock signal output by the delay device, or of a signal obtained therefrom, lies within a predetermined time window before a corresponding clock edge of the clock signal, or of the signal obtained therefrom; and means for detecting a frequency of the clock signal, including determining a duration of the time window as a function of the frequency of the clock signal detected by the second device.

* * * * *